(12) United States Patent
Tsao

(10) Patent No.: US 7,320,096 B2
(45) Date of Patent: Jan. 15, 2008

(54) SYSTEM AND METHOD FOR TESTING MEMORY AT FULL BANDWIDTH

(75) Inventor: Jay Tsao, Plano, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 511 days.

(21) Appl. No.: 10/435,153

(22) Filed: May 9, 2003

(65) Prior Publication Data

US 2004/0225935 A1    Nov. 11, 2004

(51) Int. Cl.
*G11C 29/00* (2006.01)
*G06F 11/00* (2006.01)

(52) U.S. Cl. .................. 714/718; 714/747; 714/766

(58) Field of Classification Search ............. None
See application file for complete search history.

(56) References Cited

U.S. PATENT DOCUMENTS 6,223,309 B1 *   4/2001   Dixon et al. ................. 714/703
6,408,417 B1 *   6/2002   Moudgal et al. ............ 714/764

OTHER PUBLICATIONS

Affidavit of Richard W. Adkisson, Feb. 17, 2005, 4 pages.

* cited by examiner

*Primary Examiner*—Guy Lamarre
*Assistant Examiner*—John J. Tabone, Jr.

(57) ABSTRACT

There is disclosed systems and methods for testing a memory where at least one bit field at certain address locations cannot be directly accessed. In one embodiment, random bits are populated into a data field at one of the certain address locations, and at least some of the random data bits that are copied into non-directly accessible data field. The bits which were copied from the data field are replaced with bits resulting from X/ORing the copied data bits with bits read from the non-directly accessible field, and all the data field bits as the address locations are checked for mismatched data bits.

20 Claims, 2 Drawing Sheets

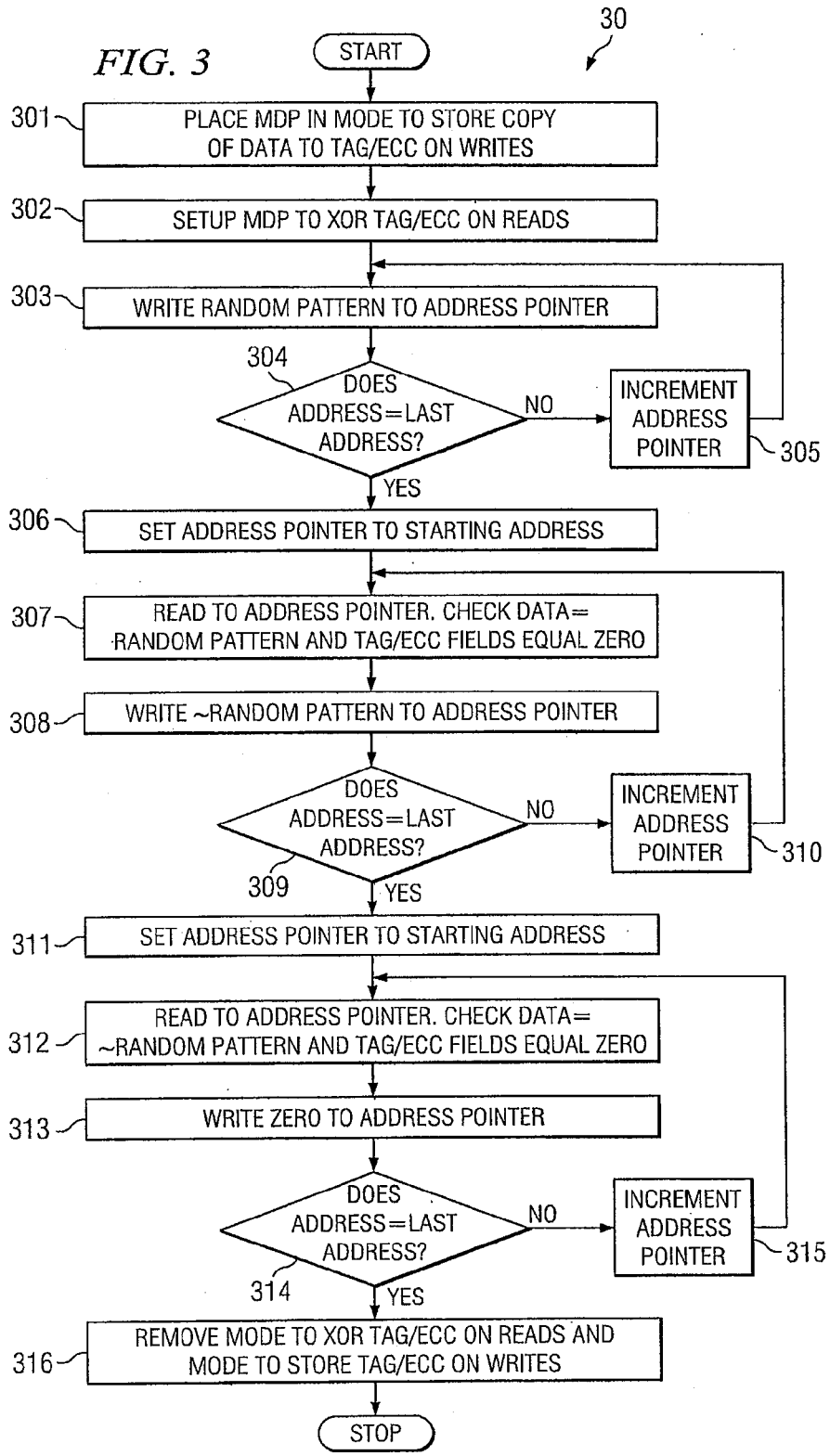

SYSTEM AND METHOD FOR TESTING MEMORY AT FULL BANDWIDTH

BACKGROUND

From time to time it is important to test computer memory to be sure that a bit, such as a 1, reads as a 1 when that location is read from. It is also important that when a 0 is stored at that same location at a later time, a 0 is subsequently read therefrom. This test is important to in order to detect and correct stuck bits and thus requires a cycle from a "1" to an "0" and back to an "1" to be certain that a bit is not stuck.

In some situations, the system can not directly access certain memory locations so detecting stuck bits is difficult. For example, the bits used to store a tag for a cache line are often not directly readable. Also, error correcting codes (ECC) are also invisible to the user process because the hardware generates those bits to make sure the data is correct when it is read from memory. Thus, ECC bits are self-generated dependent upon the bits stored at a particular location and are not stored under user control.

Currently, systems use a software loop which walks through every single address in memory, writing a pattern, reading it back, then writing the inverse of that pattern and reading it back. However, because of the issues with the tag and ECC bits, four loops through memory have typically been necessary for testing purposes.

In systems having large memories the existing bit testing process is time consuming and as memory is added the amount of initialization time increases.

SUMMARY

Embodiments provide systems and methods for testing a memory where at least one bit field at certain address locations cannot be directly accessed comprising populating a data field within one of the address locations with random data bits, copying certain of the populated data bits into the non-directly accessible data field, replacing the certain copied known data field bits with bits resulting from X/ORing the copied data bits with bits read from the non-directly accessible field, and checking all the data field bits at the address location for mismatched data bits. In one embodiment, known bits are populated into a data field at one of the certain address locations, and at least some of the known data bits that are copied into non-directly accessible data field. The bits which were copied from the data field are replaced with bits resulting from X/ORing the copied data bits with bits read from the non-directly accessible field, and all the data field bits as the address locations are checked for mismatched data bits.

BRIEF DESCRIPTION OF THE DRAWINGS

FIG. 3 shows a flow chart of one embodiment.

DETAILED DESCRIPTION

Figure 1:
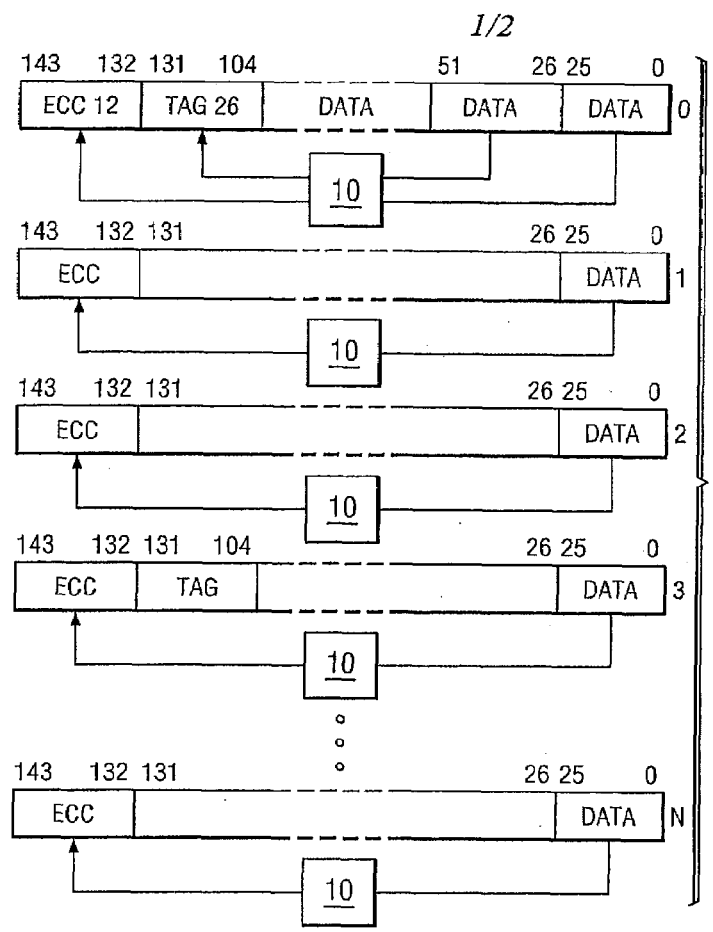
FIG. 1 shows a representative diagram of several memory lines depicted during a write operation.

FIG. 1 shows several lines 0-N of memory, each with one or more data fields and one ECC field. Some memory lines, for example, lines 0 and 3, also contain a tag field, which is shown for generalization. As will be detailed hereinafter, when the system is initializing the memory, some data bits from one of the data fields are copied into the ECC field and, if appropriate, some data bits from a data field, e.g., a second data field, are copied into the tag field. If the ECC field contains 12 bits, for example, the first 12 bits from data field 0 may be copied to the ECC field (bits 132-143). The tag field is shown having 26 bits, thus the first 26 bits from data field 1 may be copied to the tag field. Of course, portions of data fields or combinations of data fields may be utilized in providing the appropriate number of bits for a particular field, such as the aforementioned ECC field and tag field, if desired. As discussed above, the ECC and tag fields are fields not easily accessed by testing routines and usually cannot be directly read. Any other fields in the data line can be similarly handled, if desired Copying is performed by copy circuit 10.

Figure 2A:
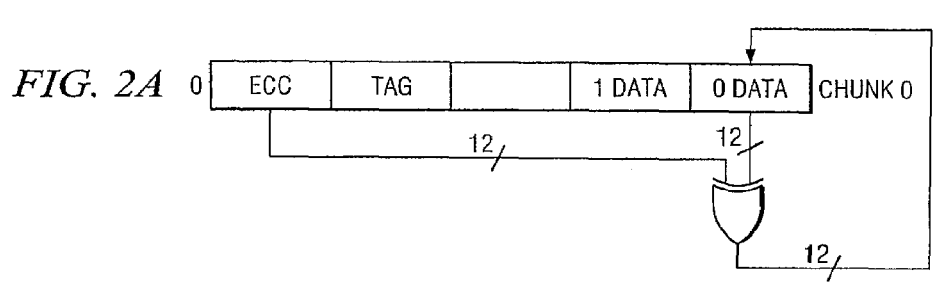
FIGS. 2A and 2B show a diagram of the memory lines of FIG. 1 during a read operation according to one embodiment.

FIG. 2A shows line 0 during the read operation where the 12 bits from the ECC field are exclusive OR (X/OR) with the original 12 bits from data block 0 and the results (which should be all zero's) are read back into block 0. The reason the results of the X/OR should be zeros is because the bits in the ECC field are the same as the bits in block 0, because it was those bits that were stored in the ECC at the previous write, as discussed with respect to FIG. 1. If the bits are not all zeros, then an error is detected.

Figure 2B:
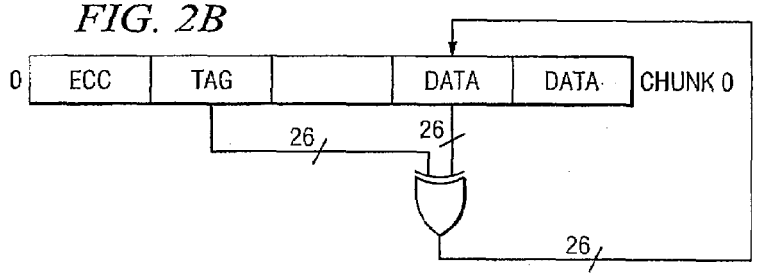

FIG. 2B illustrates that this same operation occurs with respect to the 26 bits from the tag block, if tag block is present.

The operation of the system and method will now be discussed with respect to flow chart 30, shown in FIG. 3. Memory initialization begins in process 301 by setting the memory data path (MDP) block in a mode such that it will take a copy of the data fields and store them into the tag and the ECC fields, as discussed above. In this example, the ECC field is 12 bits and the tag field is 26 bits, so the system uses a specified 12 bits of data from field 0 (FIG. 1) and puts those bits into the ECC field (assuming a tag field is present), takes a copy of 26 bits from data field 1 (FIG. 1) and puts those bits in the tag field.

Process 302 sets up the mode to take the ECC field (and the tag field, if present) and exclusive OR those bits with the copied bits from data fields 0 and 1. At this point, the system is ready to loop through every address in memory to test the memory. Processes 303, 304, and 305 control the application of a randomly generated pattern to all the addresses in memory. At point 306, all the memory locations have the random pattern stored therein. The ECC and the tag fields of each memory line have a copy of the data bits from fields 0 and 1, as discussed above. Process 306 resets the address pointer to the first address. Process 307 performs a read to the address pointer and checks that the data is equal to the random pattern and that the fields 0 and 1 which were copied to the ECC (and tag) fields have been replaced by 0's. Thus, the first 12 bits of data field 0 will have 0's therein, regardless of what random pattern was sent to that field. The remaining data field bits would be the random pattern that was originally written. When process 307 reads the data fields, the Os should be detected in the first 12 data bit positions (and in data bit positions 0-25 of field 2, if tag bits are present). If this is what is detected, then the memory is clean. Process 308 writes the opposite of the random pattern that was written during the previous write operation (this is the bitwise complement of the random pattern which causes all the bits to flip). Process 309 checks if the last address has been reached yet. If not, process 310 increments the address and the loop through memory continues.

After this loop, process 311 resets the address pointer back to the starting address. Process 312 is part of a final loop through memory, this time checking that data equals the opposite of random pattern and that fields 0 and 1 are still 0's. Process 313 writes all 0's to the address so that each memory location has been initialized to zero. Processes 314 and 315 loop through the addresses until the last address is processed. When complete the memory will have all zeros written to it and every bit has been flipped and tested for stuck faults in memory. At this point every location in memory has been tested for a stuck-at fault and also has been initialized to all zeros. Note that the system and method could test the memory line by line, as discussed or could load the entire memory (or portions thereof) and test for errors on larger portions at one time.

The final phase before the machine is put into the normal operation according to one embodiment, is to put the MDP back into the normal mode of operation, via process 316, which means it is taken out of the mode, which causes it to X/OR the tag and ECC fields on reads. The MDP is also put back to the mode where it calculates ECC normally and stores the ECC and tag bits as it normally would. The memory is initialized and is ready to start being used for executing normal code.

One implementation to support these modes of operation is by using programmable control status register (CSR) settings. The CSRs are set to take certain bits and pass them to MUX (not shown) to choose whether those bits should also be stored in the ECC or tag fields. The MUX would take as its control signal the CSR value for the mode bit and choose whether to store the normal generated ECC or the copy of data 0, as discussed, with respect to FIG. 1. There is a separate CSR control bit that acts as a MUX select for the tag fields. In order to control the read from memory, a mode bit is used to select whether it is to store zeros (in anticipation the X/OR operation code to be used for matching purposes.

The result of the system and method just discussed is a memory initialization algorithm used to pattern test all memory with only three loops. Using this arrangement, it is possible to check stuck faults for every single bit location in memory. The system and method discussed above causes the direct checking for errors as it moves through all the addresses, so it knows whenever a field is non-zero or that the pattern does not match the pattern that was written. This is in contrast to systems where the software writes patterns but does not actually check the data. In some systems, there may only be a check that the chip set did not log any ECC errors. In these systems, the ECC mode remains on during initialization. The hardware will log an ECC error and the specific address that had the error. The problem with such systems is that the memory system reorders all accesses. Thus, if the software is written to read address zero, one, two and three, the memory system can actually do it, for example, in the order of three, one, zero, two. Accordingly, these systems do not know which address was the first one that with an error. For example, assume address three logged an ECC error. Addresses zero, one, and two cannot be assumed to be good since the memory system accessed address three first. With the system and method discussed above, the software actually checks each bit for each address and knows exactly what the first address is that has an error. This operation is carried out by the processors at full bandwidth.

An alternate system which appears to reduce the number of passes through memory for testing purposes, but which actually does not test every bit is to write a random pattern to all memory in the first pass. In the second pass, the system reads back all the data that was written and then writes the opposite data, thereby, flipping every bit that was previously written. On the third pass, the system reads back the flipped bits and checks those bits and then writes zeros. The problem with such a system is that it does not have a way to directly access the ECC locations. By flipping all the data bits the assumption is that the ECC bits are error correction bits, and thus would automatically flip when the data bits changed. However, such may not be the situation. Since such a system cannot directly modify the ECC bits, nor, can it actually read these bits, there is no assurance that the ECC (or the tag) bits are correct. For absolute assurance, it is necessary to add another loop to figure out which bits were not modified and then change some of the bits in the data so that those corresponding ECC (or tag) bits would get flipped.

Another problem with the just described solution is that upon detection of a miscompare (an error) there is not a good method for determining where that error was. A simple example of such a problem is that the system cannot determine if the error is in the actual data bit, or in the ECC bits which change depending upon the data bits. The problem is compounded by memory reordering during the write cycle. Because such systems rely on the error detection chip to spot errors, which, in turn, relies on a proper ECC code, errors are hard to pinpoint.

As discussed above, one of the improvements of the instant system and method is that the underlying process has visibility to every address, so as soon as it gets a miscompare, then it knows exactly which address has a problem.

What is claimed is:

1. A method of testing a memory where at least one data field at certain address locations are non-directly accessible, said method comprising:
   populating bits of a data field within one of said address locations with random data bits;
   copying certain of said bits of said data field into bits of said non-directly accessible data field;
   replacing said certain of said bits of said data field with bits resulting from X/ORing said certain bits of said data field with bits of said non-directly accessible data field; and
   checking all said certain of said bits of said data field at said address location for mismatched data bits.

2. The method of claim 1 wherein any said mismatched bits include data field bits which should be '0', regardless of whether said data field bits were populated as a '0' or populated as a '1'.

3. The method of claim 1 further comprising:
   at the completion of said checking step, repeating said populating, copying, replacing and checking steps, wherein within said populating step each said data field bit that was originally a '1' becomes a '0' and each said data field bit that was originally a '0' becomes a '1'.

4. The method of claim 1 further comprising:
   at the completion of said checking step, repeating said populating, copying and, replacing steps for each address location, one at a time.

5. The method of claim 4 further comprising:
   wherein within said populating step of said repeating, each said data field bit that was originally a '1' becomes a '0' and each said data field bit that was originally a '0' becomes a '1'.

6. The method of claim 5 further comprising:
   at the completion of said repeating, setting all address locations to '0'.

7. A method for initializing a memory, said method comprising:
   setting an initialization mode with respect to said memory;
   writing data bits into said memory at a particular address location;
   copying certain of said data bits into at least one other field at said particular address location;
   first comparing said certain of said data bits copied into said at least one other field with said certain of said data bits and replacing said certain of said data bits with bits from said comparison; and
   reading said data bits from said address location, thereby checking every bit at said particular address location.

8. The method of claim 7 further comprising:
   writing the inverse of said data bits into said memory at said address location;
   copying certain of said data bits into at least one field of said particular address location;
   second comparing said certain of said data bits copied into said at least one other field with said certain of said data bits and replacing said certain of said data bits with bits from said comparison; and
   reading said data bits from said particular address location, thereby checking every bit at said particular address location.

9. The method of claim 8 further including the steps of continuing said writing, copying, and comparing steps for each said particular address location until all bits in said memory have been compared.

10. The method of claim 9 further comprising the steps of setting all bits in each said particular address location to zero during said second comparing step for each said particular address location.

11. The method of claim 9 wherein said first and second comparing steps include X/ORing said certain of said data bits copied into said at least one other field with said certain of said data bits such that the resultant bits are all zeros.

12. The method of claim 11 further comprising unsetting, at the conclusion of said continuing step, said initialization mode so as to inhibit said X/ORing.

13. The method of claim 7 wherein said copying step includes writing different said certain of said data bits into different fields of said particular address location.

14. A memory test system with at least one non-directly accessible bit field at certain address locations within a memory, said system comprising:
   at least one directly accessible bit field at one of said certain address locations having within it known populated data bits;
   copying circuitry for copying certain bits of said known populated data bits into bits of said at least one non-directly accessible bit field;
   bit comparison circuitry for replacing said certain bits with bits resulting from comparing said certain bits with said bits of said non-directly accessible bit field; and
   checking circuitry for comparing all bits of all directly accessible data fields at said certain address location against data bits expected to be at said address location.

15. The system of claim 14 wherein said certain bits include:
   bits which should be "0", regardless of whether said bits were populated as a "0" or a "1".

16. A system for initializing a memory, said system comprising:
   means for writing data field bits into a data field of said memory at a particular address location;
   means for copying certain bits of said data field bits into copied bits of at least one other field at said particular address location;
   means for comparing said copied bits with said certain bits;
   means for replacing said certain bits with bits generated by said means for comparing; and
   means for reading all bits of said data field at said address location, thereby checking every bit at said address location, regardless of whether said bit is within said data field or within said other field.

17. The system of claim 16 further comprising:
   means for writing an inverse of said data field bits into a data field of said memory at said particular address location;
   wherein:
      said means for copying copies certain of said inverse of said bits into said copied bits of said other field of said particular address location;
      said means for comparing compares said copied bits with said certain of said inverse of said data field bits;
      said means for replacing replaces said certain of said inverse of said bits with bits generated by said means for comparing; and
      said means for reading reads all bits from said data field at said address location, thereby checking every bit at said address location, regardless of whether said bits are within said data field or within said other field.

18. The system of claim 16 wherein said means for comparing includes:
   an X/OR circuit.

19. A method for testing bits in a memory where certain of the bits are not directly accessible to software checking routines, said method comprising:
   setting a test flag;
   during a next write operation following the setting of said test flag, placing a known pattern of bits in at least one data field of at least one data line;
   copying certain bits of said known pattern of bits from said at least one data field to at least one other field associated with said at least one data line so that said certain bits copied to said at least one other field match said certain bits;
   during a subsequent read operation following said write operation, checking that said certain bits copied to said at least one other field exactly match said certain bits;
   during a subsequent write operation reversing said known pattern of bits in said at least one data field;
   copying said certain bits from said at least one data line to said at least one other field so that said certain bits copied to said at least one other field match said certain bits;
   during a subsequent read operation following said write operation, checking that said certain bits copied to said at least one other field exactly match said certain bits; and reiterating said steps for all data lines in said memory until all data lines have been checked.

20. The method of claim 19 wherein said checking includes:

matching said certain bits copied to said at least one other field with said certain bits; and replacing said certain bits with the outputs from said matching so as to produce "0"s in said data field when said certain bits copied to said at least one other field and said certain bits exactly match.

* * * * *